United States Patent [19]
Ishitani et al.

[11] Patent Number: 4,939,364
[45] Date of Patent: Jul. 3, 1990

[54] SPECIMEN OR SUBSTRATE CUTTING METHOD USING FOCUSED CHARGED PARTICLE BEAM AND SECONDARY ION SPECTROSCOPIC ANALYSIS METHOD UTILIZING THE CUTTING METHOD

[75] Inventors: Tohru Ishitani, Sayama; Tsuyoshi Ohnishi, Kokubunji; Yoshimi Kawanami, Fuchu, all of Japan

[73] Assignee: Hitachi, Ltd., Tokyo, Japan

[21] Appl. No.: 253,558

[22] Filed: Oct. 5, 1988

[30] Foreign Application Priority Data

Oct. 7, 1987 [JP] Japan .................. 62-251492

[51] Int. Cl.[5] ............................. H01J 37/305
[52] U.S. Cl. ................... 250/309; 250/288; 250/492.2; 250/492.3
[58] Field of Search .............. 250/309, 492.21, 492.3, 250/492.2, 288

[56] References Cited

U.S. PATENT DOCUMENTS 4,367,429 1/1983 Wang et al. ............ 250/423 R
4,687,930 8/1987 Tamura et al. ............ 250/309

OTHER PUBLICATIONS

Melngailis et al., J. Vac. Sci. Technol. B4(1), Jan./Feb., 1986, pp. 176–180.

Primary Examiner—Jack I. Berman
Attorney, Agent, or Firm—Antonelli, Terry, Stout & Kraus

[57] ABSTRACT

A specimen or substrate cutting method of cutting or processing a predetermined portion of a specimen or substrate in a direction of depth thereof by generating a focused charged particle beam from a particle beam source and irradiating the predetermined portion of the specimen or substrate with the focused charged particle beam is disclosed in which a particle species of the charged particle beam is selected such that each of the melting point of the particle species itself and the melting point of an alloy or compound of the particle species and constituent atoms of the specimen or substrate is not lower than 3/2 times of the temperature of the specimen or substrate in units of absolute temperature. A secondary ion mass-spectroscopic analysis method is also disclosed in which the charged particle beam is used as a probe to mass-analyze secondary charged ion successively generated from the cut portion of the specimen or substrate.

15 Claims, 4 Drawing Sheets

SPECIMEN OR SUBSTRATE CUTTING METHOD USING FOCUSED CHARGED PARTICLE BEAM AND SECONDARY ION SPECTROSCOPIC ANALYSIS METHOD UTILIZING THE CUTTING METHOD

BACKGROUND OF THE INVENTION

The present invention relates to a cutting method of cutting or processing a predetermined portion of a device or the like uniformly in a direction of depth thereof by means of a focused charged particle beam such as a focused ion beam, and further relates to a secondary ion spectroscopic analysis method of analyzing secondary ions successively generated from the cut portion by use of the cutting method. More particularly, the present invention concerns the improvement in precision of cutting of a predetermined portion of a specimen or substrate in a direction of depth thereof.

The processing of a device by a focused charged particle beam such as a focused ion beam, for example, in order to cut off a wiring exposed on a device substrate or in order to expose a specified portion of a wiring buried in a device substrate to apply another wiring in a form extending or drawn out from the exposed portion is discussed by J. Vac. Sci. Technol. B4 (1986), pp. 176–180. In this prior art method, Ga is used as an ion species.

In the above-mentioned prior art method, no consideration is paid to the prevention of the aggregation or segregation of an irradiation ion species itself on a processed surface of a specimen or substrate or the prevention of the aggregation or segregation of an alloy, compound or the like resulting from the chemical coupling of an ion species and a device material, and hence it is difficult to maintain the precision of uniformity of the depth of a cut surface, as is shown in FIG. 1. Therefore, it is difficult to cut off a specified portion of a desired metal wiring provided in a device with a high precision or to expose only a specified portion of a desired metal wiring with a high precision. Further, also in a secondary ion spectroscopic analysis method of ion analyzing secondary charged ions generated from a specimen or substrate during the cutting of an object (specimen or substrate) by a focused charged particle beam such as a focused ion beam, no accurate uniformity of the object portion in a direction of depth is obtainable and hence data acquired by that analysis method has a poor reliability in the direction of depth.

SUMMARY OF THE INVENTION

An object of the present invention is to improve the precision of a processing depth by optimizing an irradiation ion species to prevent the irradiation ion species itself or an alloy, compound or the like of the ion species and a device material from aggregating or segregating on a processed surface.

The above object can be achieved by selecting an ion species such that each of the melting point of an irradiation ion species itself and the melting point of an alloy or compound of the irradiation ion species and a device material is so high that no aggregation or segregation of the ion species itself as well as such an alloy or compound occurs during the processing of a device.

It is half-experientially known that a substance adhering to the surface of a solid body begins to surface-diffuse when it is heated up to a temperature which is about two-thirds (⅔) of the melting point of the substance. Accordingly, in a processing under room temperature for instance, if a temperature equal to two-thirds of each of the melting point of an ion species itself and the melting point of an alloy or compound of the ion species and a device material is not lower than the room temperature, the surface diffusion of these substances at a processed surface hardly occurs upon processing at the room temperature and hence there is no aggregation or segregation of those substances on the processed surface. As a result, the processed surface is always kept uniformly upon the processing. Therefore, the processing speed is uniform at every location and the precision of processing depth is improved. Provided that the room temperature is 300° K., the temperature of workpiece (specimen or substrate) is considered as same as the temperature, the above-mentioned melting point is not lower than 450° K. (about 180° C.) which is 3/2 times of 300° K.

DESCRIPTION OF THE PREFERRED EMBODIMENTS

Embodiments of the present invention will now be explained by virtue of the accompanying drawings.

Figure 2:
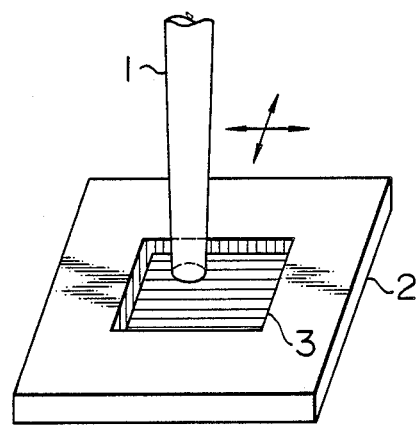
FIG. 2 is a view for explaining the concept of a cutting method according to an embodiment of the present invention.
Figure 3:
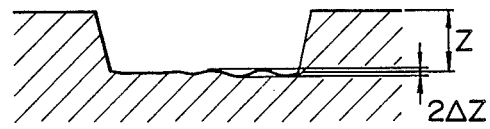
FIG. 3 is a cross section of a cut portion obtained by the method shown in FIG. 2.
Figure 4:
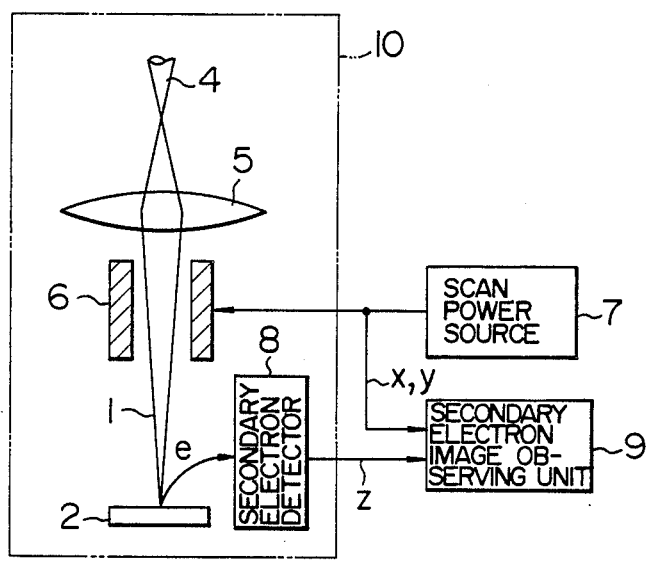
FIG. 4 is a schematic view showing an example of the construction of an apparatus.

FIGS. 2 and 3 are views for explaining the concept of a cutting method according to an embodiment of the present invention, more especially, a method of cutting or processing a device 2 by means of a focused ion beam 1. In the present embodiment, a predetermined portion 3 of the device 2 is scanned in a horizontal direction and with uniformity over a plane thereof by the focused ion beam 1, thereby effecting the cutting with a high precision of uniformity in a direction of depth. FIG. 4 is a view showing the fundamental construction of a focused beam processing apparatus which realizes the present embodiment. Ions derived from an ion source 4 are focused by an electrostatic lense 5 to form the focused ion beam 1 (hereinafter abbreviated to beam 1) which in turn bombards on a specimen 2 to be processed such as a device. In FIG. 4, reference numeral 6 designates a deflector connected to a power source 7 for scan for scanning the beam 1 on the specimen 2 to be processed. Secondary electrons are generated from the specimen 2 by irradiation thereof with the beam 1 and are detected by a secondary electron detector 8. A box 10 indicated by dotted line represents a vacuum vessel. In a cathode-ray tube (CRT) in a secondary electron image observing unit 9, a beam scanning (in x-axis and y-axis) synchronized with the scan power source 7 is carried out and an output signal from the secondary electron detector 8 corresponding to the intensity of secondary electrons is inputted to a brightness modulation axis or z-axis of the CRT. Thus, an image of secondary electrons on a plane of the specimen 2 being scanned by the beam 1 is observed by the CRT and a processing region of the specimen 2 is set through such an observation. When the processing work or operation has been completed, the intensity of secondary electrons from the processing region exhibits a value different from that before the processing operation owing to the fact that a recess is formed by the removal of the specimen material atoms in the processing region so that the underlying specimen material appears on the exposed surface. The completion of the processing operation can be confirmed by monitoring such a change of the intensity of secondary electrons.

In the present embodiment, platinum (Pt) was employed as an ion species 4 to form the focused Pt ion beam 1 which in turn is used to plane-scan an aluminum (Al) wiring portion 11 of the specimen or device 2 for cutting it. The Pt ions were formed through the mass separation, and focusing of ions emitted from a liquid metal ion source using a Pt-Sb alloy as an ion material. The diameter of the beam was about 5 $\mu$m and a beam accelerating voltage was 20 KV. The size of a processing portion 3 was about 200×300 $\mu m^2$ and the shape of the cross section of the processed portion is shown in FIG. 2. A relative percentage (=$\Delta Z/Z \times 100\%$) of the fluctuation ($\pm \Delta Z$) in depth of the bottom formed by the processing in the case where the processing depth (Z) is 8 $\mu$m, was about 5%.

The melting point of the simple substance of Pt is 1778° C. and the lowest melting point (or strictly the eutectic point) of the Pt-Al alloy ($Pt_2Al_{98}$) is 657° C. Each of those melting points is higher than the threshold temperature (180° C.) in the present invention. The melting point of the Pt-Sb alloy used as the ion source is 690° C.

Figure 1:
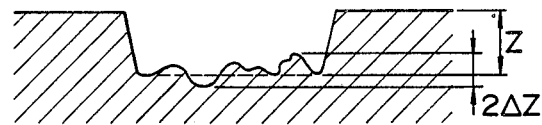
FIG. 1 schematically shows the cross section of a cut portion obtained by the conventional cutting method using a focused charged particle beam.

For comparison the shape of the cross section a processed portion obtained by the conventional method using Ga as an ion species is shown in FIG. 1. The processing conditions are the same as those in the above-mentioned embodiment of the present invention. The precision (=$\Delta Z/Z \times 100\%$) of the processing depth obtained by the conventional method was about 15%. This is mainly because the simple substance of Ga (having its melting point of 30° C.) and/or the $Ga_{90}Al_{10}$ alloy (having its melting point of 26.4° C.) aggregates or segregates on the processed bottom in the course of the processing, thereby providing no uniform bottom processed.

Figure 5:
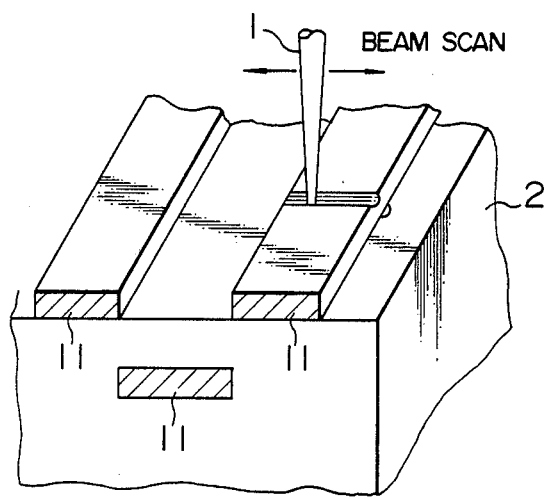
FIG. 5 is a view for explaining the concept of a wiring cutting operation in the embodiment.
Figure 6:
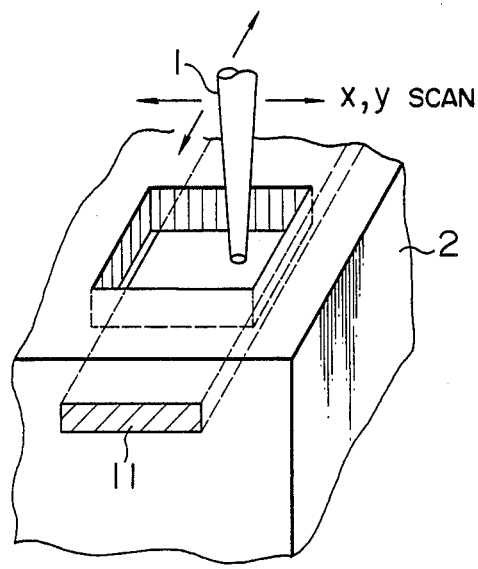
FIG. 6 is a view for explaining the concept of a scan for exposing a buried wiring portion in the embodiment.

As is apparent from the foregoing, the precision of a processing portion in a direction of depth can be improved according to the present invention. Therefore, if a scan in only an x-direction is carried out, as shown in FIG. 5, only a desired portion of the wiring 11 formed on the device 2 can be rut with a high precision. If a uniform scan in x- and 1.-directions is carried out, as shown in FIG. 6, only a desired portion of the wiring 11 buried in the device 2 can be exposed through the cutting or processing thereof so that a new wiring is provided in a form extending or drain out from the exposed portion.

A high precision of processing similar to that obtained in the above-mentioned embodiment using Pt as the ion species was obtained also in the case where a metal such as tungsten (W), tantalum (Ta), molybdenum (Mo) or niobium (Nb) is employed as the ion species. The melting points of W, Ta, Mo and Nb are 3377° C., 2977° C., 2607° C. and 2468° C., respectively. Respective examples of ion sources emitting the ion species of W, Ta, Mo and Nb are Al-W alloy (having its melting point $T_m$ of 700~900° C.), Ta-Ni alloy ($T_m$=1320° C.), Mo-Ni alloy ($T_m$=1318° C.) and Nb-Ni alloy ($T_m$=1170° C.).

Each of the above-mentioned metals W, Ta, Mo and Nb having a high melting point is advantageous in that it is thermally stable in a surface layer implanted in a surface to be processed and hence the diffusion thereof is very little so that the device processed has a high reliability over a long time.

When importance or priority is given to the long lifetime and hence the stable operation of the ion source, the ion species may be platinum (Pt) ($T_m$=1778° C.) used in the above-mentioned embodiment, antimony (Sb) ($T_m$=630.5° C.), gold (Au) ($T_m$=1063° C.) or silicon (Si) ($T_m$=1420° C.). such an ion species can be obtained from an ion material or source of Pt-Sb ($T_m$=690° C.) or Au-Si alloy ($T_m$=370° C.).

By way of example, the melting points $T_m$ of alloys formed by the irradiation of various ion beams in the case where the device material is silicon (Si) are listed up hereinunder. (The shown value of $T_m$ is one for a composition which gives the lowest melting point.)

Si-W ($T_m$=1400° C.)
Si-Mo ($T_m$=1400° C.)
Si-Nb ($T_m$=1300° C.)
Si-Sb ($T_m$=630.5° C.)
Si-Au ($T_m$=370° C.)

Next, explanation will be made of an embodiment of a secondary ion mass-spectroscopic analysis method using the above-mentioned cutting or processing method.

Figure 7:
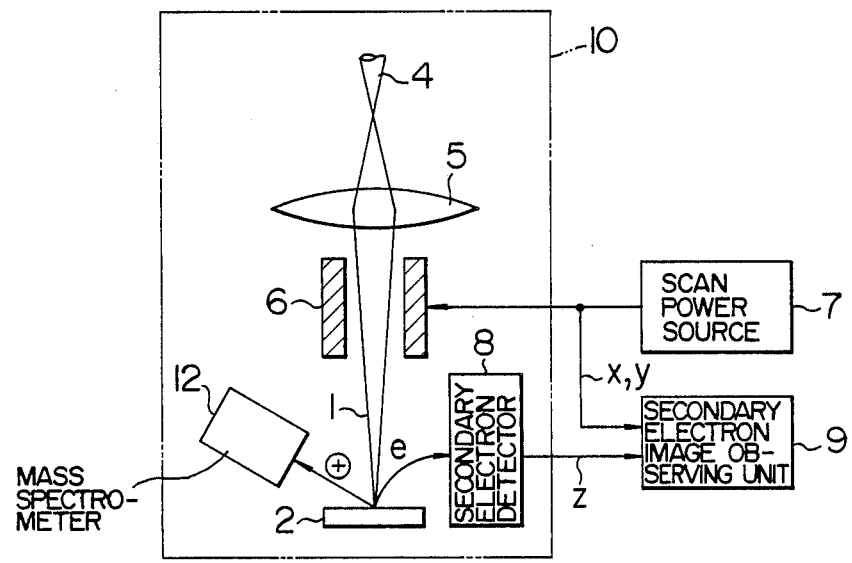
FIG. 7 is a schematic view showing an example of the construction of an apparatus for performing a mass-spectroscopic analysis method according to another embodiment of the present invention.

FIG. 7 is a schematic view showing the construction of an apparatus for performing the secondary ion mass-spectroscopic analysis method according to the embodiment of the present invention. In FIG. 7, the same reference numerals are given to components equivalent to those in the cutting or processing apparatus shown in FIG. 4 and hence any explanation thereof will be omitted. A difference of the apparatus of FIG. 7 from the apparatus of FIG. 4 is that a mass spectrometer 12 is provided for detecting secondary ions secondarily generated from the device 2 by irradiation thereof with the focused ion beam. If the intensity of a signal from the mass spectrometer 12 concerning a specified secondary ion species is inputted to a brightness modulation signal of a CRT device (not shown), an image of the specified secondary ions can be observed. If the intensity of a signal(s) from the mass spectrometer 12 concerning a specified ion species is plotted by a recorder or the like with respect to irradiation time, analytical information of constituent atoms in a direction of depth can be obtained.

Figure 8:
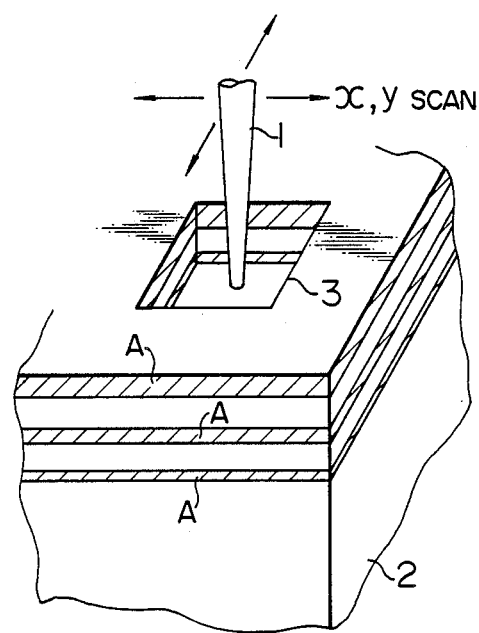
FIG. 8 is a schematic view showing a scanning state in the mass-spectroscopic analysis by the apparatus shown in FIG. 7.
Figure 9:
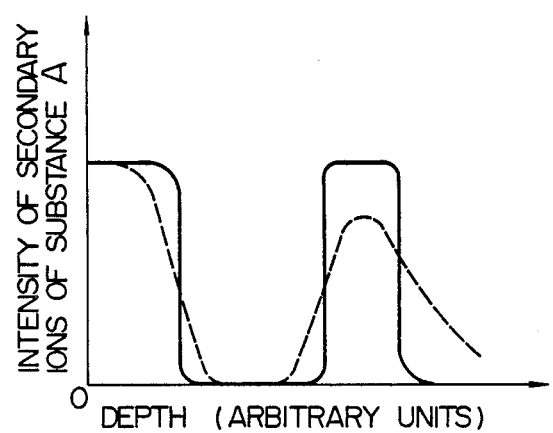
FIG. 9 shows comparative data of an example of analysis characteristics obtained by the apparatus of FIG. 7 and an example of characteristics obtained by the conventional method.

A more concrete example based on the above-mentioned procedure is shown in FIGS. 8 and 9. FIG. 8 illustrates a situation in which the actual state of layer formation for a semiconductor device having a plurality of laminated layers of substance A formed therein. When a scan of a focused ion beam 1 for a specified portion of a device 2 in x- and y-directions is carried out uniformly in a direction of depth, the layers of substance A and the device substrate layers are successively cut with secondary ions generated therefrom. In the present embodiment, such an ion species as mentioned in conjunction with the embodiment is used with the result that there is no aggregation or segregation on a scanned portion and the precision of uniformity in a direction of depth is maintained. Therefore, the result of mass-spectroscopic analysis having a high precision in a direction of depth as shown by solid line in FIG. 9 can be obtained. Dotted line in FIG. 9 represents a similar result obtained through the conventional method.

In the foregoing description, there is mainly described employing an ion beam as a charged particle beam, it should be understood that other forms of charged particle beams can also be used for the purpose without departing from the spirit or essential characteristics of this invention.

We claim:

1. A specimen or substrate cutting method of cutting a predetermined portion of a specimen or substrate in a direction of depth thereof by generating a focused charged particle beam from a particle beam source and uniformly irradiating said predetermined portion of said specimen or substrate with said focused charged particle beam, in which a particle species of said charged particle beam is selected such that each of the melting point of said particle species itself and the melting point of an alloy or compound of said particle species and constituent atoms of said specimen or substrate is a temperature not lower than 3/2 times the temperature of said specimen or substrate in units of absolute temperature.

2. A specimen or substrate cutting method according to claim 1, wherein said temperature not lower than 3/2 times of the temperature of said specimen or substrate is not lower than 180° C.

3. A specimen or substrate cutting method according to claim 2, wherein the melting point of an ion material of said particle beam source generating said charged particle beam is not higher than 1100° C.

4. A specimen or substrate cutting method according to claim 3, wherein said ion material of the particle beam source is Pt-Sb or Au-Si alloy.

5. A specimen or substrate cutting method according to claim 1, wherein the melting point of said particle species is not lower than 2000° C.

6. A specimen or substrate cutting method according to claim 5, wherein said particle seed is at least one selected from the group consisting of W, Ta, Mo and Nb.

7. A specimen or substrate cutting method according to claim 6, wherein said ion material of the particle beam source generating said charged particle beam is at least one selected from the group consisting of Al-W, Ta-Ni, Mo-Ni and Nb-Ni alloy.

8. A specimen or substrate cutting method which comprises; focusing a charged particle beam, irradiating the particle beam on a surface of a specimen or substrate, so as to cut a predetermined portion of the specimen or substrate, wherein the method is operated under the condition of $$X_1°K, X_2°K \geq 3/2 Y°K$$

where $X_1$ is a melting temperature of at least one kind of particle species in said charged particle beam, $X_2°$ is a melting temperature of alloy or compound composed of said particle species and said specimen or substrate, $Y°$ is a temperature of said specimen or substrate under irradiation of said charged particle.

9. A secondary ion mass-spectroscopic analysis method including cutting a predetermined portion of a specimen or substrate in a direction of depth thereof by generating a focused charged particle beam from a particle beam source and uniformly irradiating said predetermined portion of said specimen or substrate with said focused charged particle beam, in which a particle species of said charged particle beam is selected such that each of the melting point of said particle species itself and the melting point of an alloy or compound of said particle species and constituent atoms of said specimen or substrate is a temperature not lower than 3/2 times the temperature of said specimen or substrate in units of absolute temperature, in which said charged particle beam is used as a probe to mass-analyze secondary ion successively generated from the cut portion of said specimen or substrate.

10. A secondary ion mass-spectroscopic analysis method according to claim 9, wherein said temperature not lower than 3/2 times of the temperature of said specimen or substrate is not lower than 180° C.

11. A secondary ion mass-spectroscopic analysis method according to claim 10, wherein the melting point of an ion material in said particle beam source generating said charged particle beam is not higher than 1100° C.

12. A secondary ion mass-spectroscopic analysis method according to claim 11, wherein said ion material in the particle beam source is Pt-Sb or Au-Si alloy.

13. A secondary ion mass-spectroscopic analysis method according to claim 9, wherein the melting point of said particle seed is not lower than 2000° C.

14. A secondary ion mass-spectroscopic analysis method according to claim 13, wherein said particle species is one selected from the group consisting of W, Ta, Mo and Nb.

15. A secondary ion mass-spectroscopic analysis method according to claim 14, wherein said ion material of the particle beam source generating said charged particle beam is one selected from the group consisting of Al-W, Ta-Ni, Mo-Ni and Nb-Ni alloy.

* * * * *